(12) United States Patent
Roh et al.

(10) Patent No.: US 9,269,882 B2
(45) Date of Patent: Feb. 23, 2016

(54) THERMOELECTRIC MATERIAL, THERMOELECTRIC ELEMENT AND MODULE INCLUDING THE SAME, AND METHOD OF PREPARING THE THERMOELECTRIC MATERIAL

(71) Applicants: Samsung Electronics Co., Ltd., Suwon-si, Gyeonggi-do (KR); Industry-Academic Cooperation Foundation, Yonsei University, Seoul (KR)

(72) Inventors: Jong-wook Roh, Yongin-si (KR); Jung-young Cho, Chungcheongnam-do (KR); Weon-ho Shin, Basan (KR); Dae-jin Yang, Yeongju-si (KR); Kyu-hyoung Lee, Hwaseong-si (KR); Un-yong Jeong, Seoul (KR)

(73) Assignees: SAMSUNG ELECTRONICS CO., LTD. (KR); INDUSTRY-ACADEMIC COOPERATION FOUNDATION, YONSEI UNIVERSITY (KR)

( * ) Notice: Subject to any disclaimer, the term of this patent is extended or adjusted under 35 U.S.C. 154(b) by 173 days.

(21) Appl. No.: 13/925,931

(22) Filed: Jun. 25, 2013

(65) Prior Publication Data

US 2014/0137916 A1    May 22, 2014

(30) Foreign Application Priority Data

Nov. 16, 2012    (KR) ........................ 10-2012-0130511

(51) Int. Cl.
*H01L 35/28* (2006.01)
*H01L 35/32* (2006.01)
*H01L 35/16* (2006.01)
*H01L 35/34* (2006.01)
*G01K 7/02* (2006.01)
*B82Y 30/00* (2011.01)
*B82Y 20/00* (2011.01)

(52) U.S. Cl.
CPC ................ *H01L 35/32* (2013.01); *G01K 7/028* (2013.01); *H01L 35/16* (2013.01); *H01L 35/34* (2013.01); *B82Y 20/00* (2013.01); *B82Y 30/00* (2013.01)

(58) Field of Classification Search
CPC ............................... H01L 35/16; H01L 35/32
USPC .................................... 136/200–205
See application file for complete search history.

(56) References Cited

U.S. PATENT DOCUMENTS

2002/0172820 A1* 11/2002 Majumdar et al. ............ 428/357
2010/0212711 A1* 8/2010 Liu et al. ........................ 136/205

FOREIGN PATENT DOCUMENTS

JP    2004-193526 A    7/2004
KR    1020080106504 A    12/2008

OTHER PUBLICATIONS

Markussen T. et al., "Surface-Decorated Silicon Nanowires: A Route to High-ZT Thermoelectrics", Physical Review Letters, Jul. 31, 2009, 103, 055502-1-055502-4.
Min et al., "Quick, Controlled Synthesis of Ultrathin Bi2Se3 Nanodiscs and Nanosheets", J. Am. Chem. Soc., 2012, 134, pp. 2872-2875.

* cited by examiner

*Primary Examiner* — Allison Bourke
*Assistant Examiner* — Niki Bakhtiari
(74) *Attorney, Agent, or Firm* — Cantor Colburn LLP

(57) ABSTRACT

A thermoelectric material including a 3-dimensional nanostructure, wherein the 3-dimensional nanostructure includes a 2-dimensional nanostructure connected to a 1-dimensional nanostructure.

24 Claims, 8 Drawing Sheets

Phonon scattering

Phonon scattering

THERMOELECTRIC MATERIAL, THERMOELECTRIC ELEMENT AND MODULE INCLUDING THE SAME, AND METHOD OF PREPARING THE THERMOELECTRIC MATERIAL

CROSS-REFERENCE TO RELATED APPLICATION

This application claims priority to and the benefit of Korean Patent Application No. 10-2012-0130511, filed on Nov. 16, 2012, and all the benefits accruing therefrom under 35 U.S.C. §119, the content of which is incorporated herein in their entirety by reference.

BACKGROUND

1. Field

The present disclosure relates a thermoelectric material, a thermoelectric element and a thermoelectric module including the same, and a method of preparing the thermoelectric material.

2. Description of the Related Art

A thermoelectric phenomenon is a reversible, direct energy conversion from heat to electricity and vice versa, which occurs when electrons and holes move within a material.

One example of the thermoelectric phenomenon includes the Peltier effect, in which two dissimilar materials are connected at a contact point where heat is released or absorbed due to a current applied from the outside. Another example is the Seebeck effect, in which an electromotive force is generated due to a temperature difference between the ends of the dissimilar materials that are connected at the contact point. Another example is the Thomson effect, in which heat is released or absorbed when a current is applied to the material having a predetermined temperature gradient.

When thermoelectric materials are used, low-temperature waste heat may be directly converted to electricity, or heat generated from electricity, thus energy use efficiency may be increased. Also, thermoelectric materials may be applied in various fields to provide devices such as a thermoelectric generator, a thermoelectric cooler, or the like.

The performance of a thermoelectric material is evaluated using a dimensionless figure of merit ZT defined by Equation 1:

$$ZT = \frac{S^2 \sigma T}{\kappa} \quad \text{Equation 1}$$

In Equation 1, ZT is a figure of merit, S is a Seebeck coefficient, σ is an electrical conductivity, T is an absolute temperature, and κ is a thermal conductivity.

To increase energy conversion efficiency, a thermoelectric material having a high Seebeck coefficient, a high electrical conductivity, and a low thermal conductivity is desired, but generally, a Seebeck coefficient, an electrical conductivity, and a thermal conductivity have a trade-off relationship.

Because a nanostructure has a small particle size compare to a bulk material, an intragranular density can increase, and thus scattering of phonons at interfaces of the nanostructure can increases. In this regard, thermal conductivity can be decreased, and the trade-off relationship between a Seebeck coefficient and an electric conductivity can collapses due to a quantum confinement effect, and a figure of merit may increase.

A nanostructure may be, for example, a superlattice thin film, nanowires, quantum dots, or the like, but manufacture of such nanostructures is difficult, and a figure of merit in a bulk material is low.

Therefore, a nanostructure that provides a simple manufacturing process and an improved figure of merit in a bulk would be desirable.

SUMMARY

Provided is a thermoelectric material with a novel structure that provides an improved figure of merit.

Provided is a thermoelectric device including the thermoelectric material.

Provided is a thermoelectric apparatus including the thermoelectric device.

Provided is a method of preparing the thermoelectric material.

Additional aspects will be set forth in part in the description which follows and, in part, will be apparent from the description.

According to an aspect, a thermoelectric material includes a 3-dimensional ("3D") nanostructure, wherein the 3-dimensional nanostructure includes a 2-dimensional ("2D") nanostructure connected to a 1-dimensional ("1D") nanostructure.

According to another aspect, a thermoelectric element includes the thermoelectric material.

According to another aspect, a thermoelectric module includes a first electrode; a second electrode; and the thermoelectric element interposed between the first and second electrodes.

According to another aspect, a method of preparing a thermoelectric material includes: forming a seed by stirring a solution including a thermoelectric material precursor at a temperature of 100° C. or higher; and forming a 3-dimensional nanostructure by adding a reducing agent in the solution including the seed to prepare the thermoelectric material.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
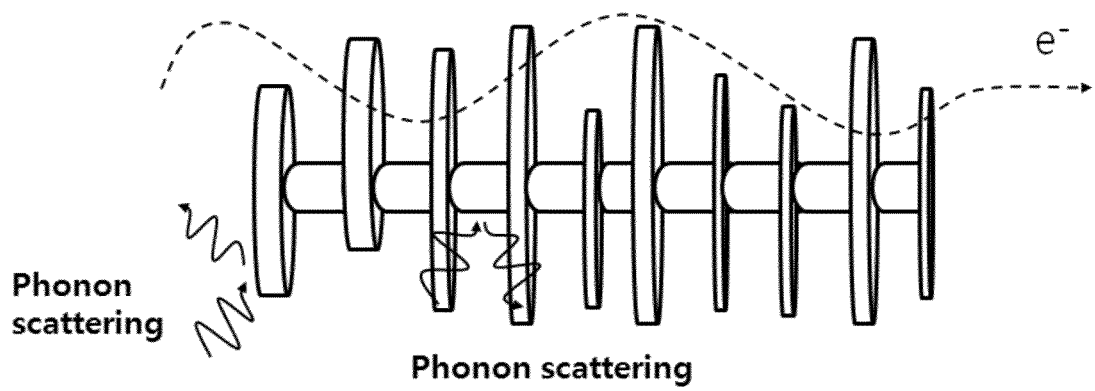
FIG. 1 is a schematic view of an embodiment of a 3-dimensional ("3D") nanostructure and a method of phonon scattering.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. "Or" means "and/or." Expressions such as "at least one of," when preceding a list of elements, modify the entire list of elements and do not modify the individual elements of the list.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a thermoelectric material, a thermoelectric device and a thermoelectric module including the same, and a method of preparing the thermoelectric material according to an embodiment will be described in further detail.

A thermoelectric material according to an embodiment includes a 3-dimensional ("3D") nanostructure, in which a 2-dimensional ("2D") nanostructure is connected to a 1-dimensional ("1D") nanostructure.

As used herein, the 1D nanostructure is a 1D structure having a cross-sectional length, e.g., a diameter or thickness, in a range of about 1 nm to about 1000 nm in two or more dimensions, e.g., dimensions perpendicular to a longitudinal length, and the 2D nanostructure is a structure having a cross-sectional length, e.g., a thickness, in a range of about 1 nm to about 1000 nm in one or more dimension, and the 3D nanostructure is a 3D structure that comprises the 1D nanostructure and the 2D nanostructure.

The 3D nanostructure includes the 2D nanostructure having a selected area and connected to the 1D nanostructure having a selected length. The longitudinal length of the 1D nanostructure and the area of the 2D nanostructures are not particularly limited, but may be from several nanometers to several hundreds of micrometers, several nanometers to several micrometers, or several nanometers to several hundreds of nanometers, specifically a longitudinal length of about 3 nanometers (nm) to about 1000 micrometers (μm), more specifically about 6 nm to about 500 μm; and an area of about 3 square nanometers (nm²) to about 1000 square micrometers (μm²), more specifically about 6 nm² to about 500 μm².

The 2D nanostructure serves as a nano-branch connected to a stem formed of the 1D nanostructure so as the 3D nanostructure may have a nano-tree shape. For example, FIG. 1 shows a schematic view of an example of the 3D nanostructure. Since the 3D nanostructure has an improved surface area/volume ratio than the 1D or 2D nanostructure, increased photon scattering at grain boundaries and at the interfaces of the nanostructures may be induced.

In particular, as the 3D nanostructure has a nanosized dimension due to the 1D nanostructure, scattering of long-wavelength phonons may be enabled, and as the 3D nanostructure further includes the 2D nanostructures having a complicated and fine structure, additional scattering of mid-wavelength phonons and short-wavelength phonons may be enabled. Thus, as phonons of most wavelengths are scattered, heat transfer by the phonons may be effectively blocked. Also, the 2D nanostructures are arranged at a narrow interval on the 1D nanostructure, e.g., an interval of about 10 nm to about 0.5 μm, and electrons transferred within the thermoelectric material have a relatively long-wavelength compared to the phonons, and thus the electron transfer may not be substantially affected in spite of an additional introduction of the 2D nanostructures. Particularly, in a semiconductor, a portion of the electron thermal conductivity is smaller than that of the lattice thermal conductivity of the total thermal conductivity, thus the effect of an introduction of the 2D nanostructure on the electron transfer may be further reduced.

In the thermoelectric material, the 1D nanostructure may comprise a nanowire, but is not limited thereto. The 1D nanostructure may be any suitable material, such as a nanofiber, nanotube, nanorod, nanobelt, or the like, that may be used as a 1D nanostructure.

The 1D nanostructure may have a diameter less than about 1000 nm, e.g., about 10 to about 1000 nm. For example, the 1D nanostructure may have a diameter less than about 800 nm. For example, the 1D nanostructure may have a diameter less than about 600 nm. For example, the 1D nanostructure may have a diameter less than about 500 nm. For example, the 1D nanostructure may have a diameter less than about 300 nm. When a cross-section of the 1D nanostructure is not a circle, the term "diameter" used herein refers to an average of a largest diameter and a smallest diameter of a cross-section that is perpendicular to a longitudinal axis of the 1D nanostructure.

The 1D nanostructure may have a diameter less than about 1000 nm, and a diameter of the 1D nanostructure may have a difference between the maximum diameter and the minimum diameter of less than about 50% along a direction of the longitudinal axis. For example, the 1D nanostructure may have a diameter less than about 1000 nm, and a diameter of the 1D nanostructure may have a difference between the maximum diameter and the minimum diameter of less than about 25% along a direction of the longitudinal axis. For example, the 1D nanostructure may have a maximum diameter less than about 1000 nm, and a diameter of the 1D nanostructure may have a difference between the maximum and the minimum diameters of less than about 10% along a direction of the longitudinal axis.

For example, the 1D nanostructure may have a cylindrical shape, and a diameter of the cylinder may be less than about 1000 nm, less than about 800 nm, less than about 600 nm, less than about 500 nm, or less than about 300 nm, or about 10 nm to about 1000 nm.

In the thermoelectric material, the 2D nanostructures may comprise nanoplates, but are not limited thereto. The 2D nanostructures may be comprise any suitable shape for a thermoelectric material, and may comprise nanodisks, nanosheets, or the like that may be used as 2D nanostructures.

A 2D space formed by the 2D nanostructures may have a shape of a circle, an oval, an annulus such as a doughnut or a toroid, a hexagon, a rectangle, a pentagon, a triangle, a bar-like shape, or a needle-like shape, but the shape is not limited thereto. The 2D space may be any suitable shape forming a 2D space in the art.

The 2D nanostructure may have a thickness less than about 300 nm, or about 10 nm to about 300 nm. For example, the 2D nanostructure may have a thickness less than about 200 nm. For example, the 2D nanostructures may have a thickness less than about 100 nm. For example, the 2D nanostructures may have a thickness less than 80 nm. For example, the 2D nanostructures may have a thickness less than 50 nm. When distances between two opposite surfaces of the 2D nanostructures are not constant, the term "thickness" used herein refers to an average of the maximum and the minimum distance between the opposite surfaces.

For example, the 2D nanostructures may have a thickness less than 300 nm, and a difference between the maximum and the minimum distances may be less than about 25%, specifically about 3% to about 25%. For example, the 2D nanostructures may have a thickness less than 300 nm, and a difference between the maximum and the minimum distances may be less than about 10%.

For example, the 2D nanostructure may have a circular-plate shape, and a thickness of the circular-plate shape may be less than about 300 nm, about 10 to about 300 nm, or less than about 200 nm, less than about 100 nm, less than about 80 nm, or less than about 50 nm.

The 3D nanostructure may have a structure in which the 1D nanostructure penetrates through at least one surface formed by the 2D nanostructures. That is, the 1D nanostructure may be disposed in a direction protruding from, e.g., perpendicular to, the surface formed by the 2D nanostructures. An angle formed by the protruding 1D nanostructure and the surface of the 2D nanostructures may be 30 degrees or greater. For example, an angle formed by the protruding 1D nanostructure and the surface of the 2D nanostructures may be about 45 degrees or greater, specifically about 45 to about 90 degrees. For example, an angle formed by the protruding 1D nanostructure and the surface of the 2D nanostructures may be about 60 degrees or greater. For example, an angle formed by the protruding 1D nanostructure and the surface of the 2D nanostructures may be about 70 degrees or greater. For example, an angle formed by the protruding 1D nanostructure and the surface of the 2D nanostructures may be about 80 degrees or greater. For example, an angle formed by the protruding 1D nanostructure and the surface of the 2D nanostructures may be about 90 degrees or greater. In this regard, scattering of phonons in the 3D nanostructure may increase.

A point where the 1D nanostructure penetrates the planar surface formed by the 2D nanostructures may be near a center of the planar surface. The planar surface formed by the 2D nanostructures may be a circular plane. For example, the 1D nanostructure may penetrate the planar surface at a point which is located within a distance that is half or less of a radius of the circular plane.

Also, the 3D nanostructure may have a structure in which a 1D nanostructure penetrates a plurality of 2D nanostructures that are disposed, e.g., spaced at a selected distance along the 1D nanostructure. For example, the 3D nanostructure may have a structure as shown in FIG. 1.

Moreover, the plurality of 2D nanostructures may be arranged in a single direction with respect to the 1D nanostructure. That is, the plurality of 2D nanostructures may form substantially the same angle with the 1D nanostructure that penetrates the 2D nanostructures. For example, a difference between the maximum and the minimum angles formed by the plurality of 2D nanostructures and the 1D nanostructure may be about 30 degrees or less, specifically about 2 to about 30 degrees. For example, a difference between the maximum and the minimum angles formed by the plurality of 2D nanostructures and the 1D nanostructure may be about 20 degrees or less. For example, a difference between the maximum and the minimum angles formed by the plurality of 2D nanostructures and the 1D nanostructure may be about 10 degrees or less.

In the thermoelectric material, at least a portion of a surface of the 2D nanostructures included in the 3D nanostructure may be twisted. For example, as shown in FIG. 2C, a plane of the 2D nanostructure may be twisted. As at least a portion of a surface of the 2D nanostructure is twisted, a surface area of the 3D nanostructure may increase.

In the 3D nanostructure, the 1D nanostructure and the 2D nanostructures may form a single unitary body. That is, the 1D nanostructure and the 2D nanostructures may be chemically bonded rather than physically in contact. As the 1D nanostructure and the 2D nanostructures form a single unitary body, scattering of phonons may be improved. The 1D nanostructure and the 2D nanostructures may be connected by homojunctions or heterojunctions. The 1D nanostructure and the 2D nanostructures may be homostructures having the same chemical composition or may be heterstructures having different chemical compositions from each other. The 3D nanostructure may be a single crystal or polycrystalline.

In the thermoelectric material, the 3D nanostructure may include a semiconductor including an element that belongs to Group III or Group VI of the Periodic Table, and may be selectively doped. The semiconductor may include a doped or undoped V-VI type semiconductor, a doped or undoped III-V type semiconductor, or the like.

In the thermoelectric material, the 3D nanostructure may include a chalcogenide compound. For example, the 3D nanostructure may include at least one compound selected from Formulas 1 to 2 below:

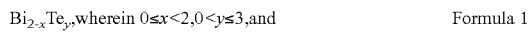

$Bi_{2-x}Te_y$, wherein $0 \leq x < 2, 0 < y \leq 3$, and  Formula 1

$Bi_{2-x}Se_y$, wherein $0 \leq x < 2, 0 < y \leq 3$.  Formula 2

The thermoelectric material may include a bulk material formed of the 3D nanostructure. The thermoelectric material is a nanobulk (i.e., bulk nanomaterial) which is a bulk but retains a structural characteristic of the 3D nanostructure. The nanobulk thermoelectric material may be pressure-sintered, that is prepared by pressuring and sintering the 3D nanostructure powder.

The nanobulk thermoelectric material may be pressure-sintered using any suitable method. For example, the 3D nanostructure powder may be put into a mold with a predetermined shape, and may be molded using a hot press method, for example, at a high temperature of about 300° C. to about 800° C. and a high pressure, for example, about 30 MPa to about 300 MPa. For example, the nanobulk thermoelectric material may be manufactured using a spark plasma sintering method including sintering the 3D nanostructure powder in a short period of time by applying a high current under a high pressure condition, for example a current of about 50 amperes (A) to about 500 A under a pressure condition of about 30 megaPascals (MPa) to about 300 MPa. For example, the nanobulk shaped thermoelectric material may be manufactured using a hot forging method including pressure-sintering the 3D nanostructure powder at a high temperature of, for example about 300° C. to about 700° C. while press-molding the 3D nanostructure powder.

Due to the densification process, the thermoelectric material have a density of about 70 to about 100% of a theoretical density. The theoretical density is calculated by dividing a molecular weight with an atomic volume and evaluated by a lattice constant. For example, the densified thermoelectric material may have a density of about 95 to about 100%, and correspondingly has a higher electrical conductivity.

Since the nanobulk shaped thermoelectric material may be manufactured in various forms, a high efficiency thermoelectric device with a thickness of 1 millimeter (mm) or less, e.g., about 0.01 to about 1 mm, may be manufactured. The thermoelectric material may be easily manufactured in a bulk unlike other nanostructures, provides a high figure of merit even in the bulk, and thus may be applied for industrial uses.

The thermoelectric material may further include a nanostructure in addition to the 3D nanostructure. For example, the thermoelectric material may further include at least one 1D and/or 2D nanostructure selected from nanoplates, nanodisks, nanosheets, nanowires, nanofibers, nanobelts, nanotubes, nanocrystals, and nanopowders.

The thermoelectric material may form a composite by further including a bulk thermoelectric material matrix that is inactive with respect to the 3D nanostructure. For example, the composite may have a structure in which 3D nanostructure is introduced to interface of crystals or within the crystalline structure of a bulk crystalline thermoelectric material matrix.

The bulk thermoelectric material matrix is not particularly limited and may be any suitable thermoelectric material that does not react with the 3D nanostructure. For example, the bulk thermoelectric material matrix may be crystalline and may include an element selected from the group bismuth (Bi), antimony (Sb), tellurium (Te), and selenium (Se). For example, a formula of the thermoelectric material matrix may be $A_2B_3$ (here, A is Bi and/or Sb, and B is Te and/or Se). For example, when a Bi—Te based thermoelectric material is used, a thermoelectric performance at around room temperature may be excellent.

According to another embodiment, a thermoelectric element may include a thermoelectric material including the 3D nanostructure. The thermoelectric element may be a p-type thermoelectric element or an n-type thermoelectric element. The thermoelectric element may comprise a thermoelectric composite structure having a selected shape, for example, a thermoelectric composite structure having a rectilinear shape, specifically parallelepiped shape.

In addition, the thermoelectric element may be connected to an electrode and may generate a cooling effect when a current is applied thereto, and may generate power using the temperature difference.

A thermoelectric module according to another embodiment includes a first electrode, a second electrode, and a thermoelectric element that is interposed between the first and second electrodes, wherein the thermoelectric element includes a thermoelectric material including the 3D nanostructure.

For example, the thermoelectric module may be implemented to generate a current through the thermoelectric element when there is a temperature difference between the first electrode and the second electrode. In the thermoelectric apparatus, the thermoelectric element includes the thermoelectric material including the 3D nanostructure, a first end of the thermoelectric element is in contact with the first electrode, and a second end of the thermoelectric element is in contact with the second electrode. When a temperature of the first electrode is increased to a temperature higher than a temperature of the second electrode, or when a temperature of the second electrode is decreased to a temperature lower than a temperature of the first electrode, a current that flows from the first electrode to the thermoelectric element and passes through the thermoelectric element to flow into the second electrode may be generated. While the thermoelectric module is being operated, the first electrode and the second electrode may be electrically connected.

Moreover, the thermoelectric apparatus further includes a third electrode and may further include a thermoelectric element that is interposed between the first electrode and the third electrode.

For example, the thermoelectric apparatus includes the first electrode, the second electrode, the third electrode, the p-type thermoelectric element having a first end and a second end, and the n-type thermoelectric element having a first end and a second end, wherein the first end of the p-type thermoelectric element is in contact with the first electrode, the second end of the p-type thermoelectric element is in contact with the third electrode, the first end of the n-type thermoelectric element is in contact with the first electrode, and the second end of the p-type thermoelectric element is in contact with the second electrode. Thus, when a temperature of the first electrode is higher than the second electrode and the third electrode, a current that flows from the second electrode to the n-type thermoelectric element, to the first electrode through the n-type thermoelectric element, to the p-type nanostructure through the first electrode, and to the third electrode through the p-type nanostructure may be generated. The second electrode and the third electrode may be electrically connected while the thermoelectric apparatus is being operated. At least one of the p-type thermoelectric element and the n-type thermoelectric element includes the thermoelectric material that includes the 3D nanostructure.

The thermoelectric module may further include an insulating substrate on which at least one of the first electrode and the second electrode, and optionally the third electrode is disposed.

The insulating substrate may comprise at least one selected from a gallium arsenic (GaAs), sapphire, silicon, Pyrex, and a quartz substrate. The electrode may comprise at least one selected from aluminum, nickel, gold, and titanium, and may have any suitable size. The electrode may be patterned by using any suitable patterning methods, such as a lift-off semiconductor process, a deposition method, or a photolithography method.

Figure 6:
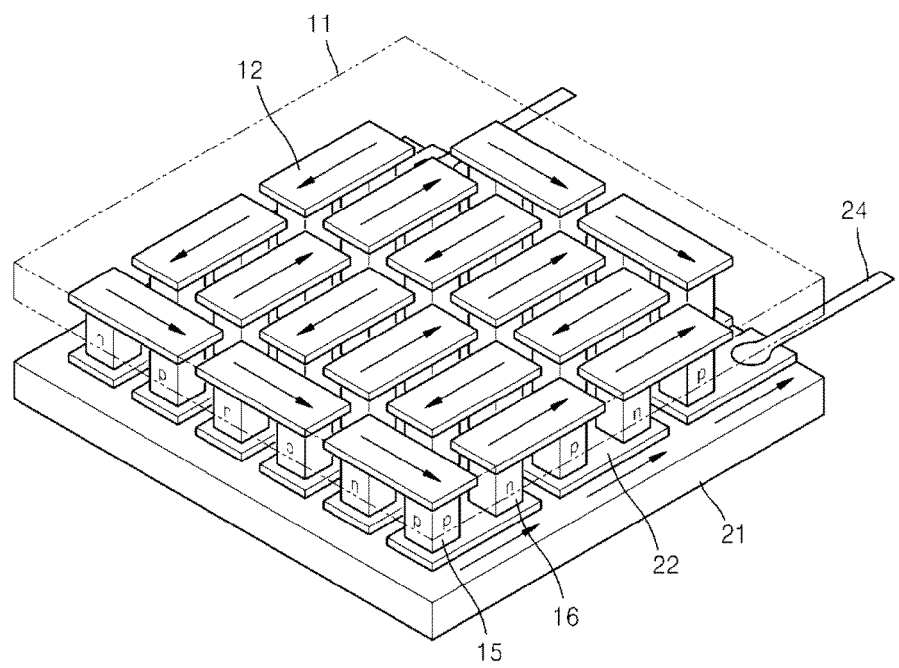
FIG. 6 is a schematic view of an embodiment a thermoelectric module.

FIG. 6 is an example of the thermoelectric module including the thermoelectric element. As shown in FIG. 6, a top electrode 12 and a bottom electrode 22 are patterned on a top insulating substrate 11 and a bottom insulating substrate 21, respectively. The top electrode 12 and the bottom electrode 22 contact a p-type thermoelectric element 15 and an n-type thermoelectric element 16 respectively. The top electrode 12 and the bottom electrode 22 are connected to the outside of the thermoelectric module by a lead electrode 24.

In the thermoelectric module, the p-type thermoelectric element 15 and the n-type thermoelectric element 16 may be alternately aligned as shown in FIG. 6, and at least one of the p-type thermoelectric element 15 and the n-type thermoelectric element 16 may include the thermoelectric material including the 3D nanostructure.

In the thermoelectric module, one of the first electrode and the second electrode may be electrically connected to a power source. A temperature difference between the first electrode and the second electrode may be 1 degree or greater, 5 degrees or greater, 50 degrees or greater, 100 degrees or greater, or 200 degrees or greater. A temperature of each of the first electrode and the second electrode may be any suitable temperature as long as the temperature does not cause melting of elements or current interference in the thermoelectric apparatus.

Figure 7:
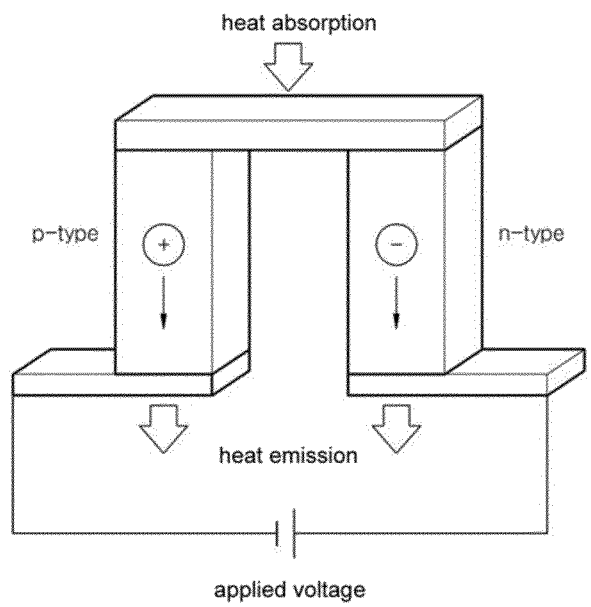
FIG. 7 is a schematic view of an embodiment of a thermoelectric cooler.
Figure 8:
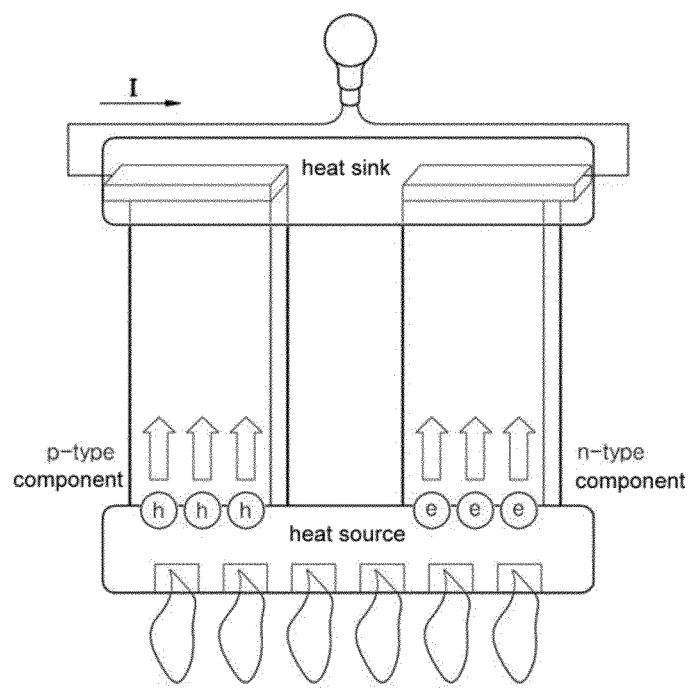
FIG. 8 is a schematic view of an embodiment of a thermoelectric generator.

In the thermoelectric module, one of the first electrode and the second electrode, and optionally the third electrode, may be electrically connected to a power source as shown in FIG. 7, or to an electric element (e.g., a battery) that consumes or stores power outside the thermoelectric apparatus as shown in FIG. 8.

The thermoelectric module may be contained in an apparatus selected from a thermoelectric generator, a thermoelectric cooler, and a thermoelectric sensor, but is not limited thereto, and any suitable apparatus that may directly convert heat and electricity may be used. The structure and manufacturing method of the thermoelectric cooling system are well known in the art, and thus will not be described in further detail herein.

A method of preparing a thermoelectric material according to another embodiment includes forming a seed by stirring a solution including a thermoelectric material precursor at a high temperature of 100° C. or higher; and forming a 3D nanostructure by adding a reducing agent to the solution including the seed.

Figure 5:
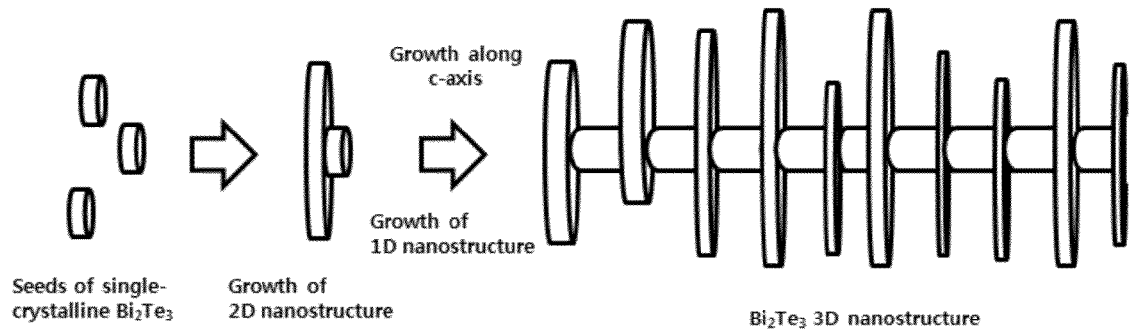
FIG. 5 is a schematic view illustrating an embodiment of a process of forming the 3D nanostructure prepared in Example 1.

For example, as shown in FIG. 5 and while not wanting to be bound by theory, nanobranches having 2D structures are understood to be formed on the seed due to the addition of the reducing agent after the single-crystalline seed of the thermoelectric material is formed in the solution at a high temperature. Further, during the formation of the 2D nanobranch or after forming the 2D nanobranch, the 1D nanostructure is understood to grow along a c-axis of the single crystalline seed, and thus a 3D nanostructure may be formed by the formation of the 1D nanostructure.

In the preparation method, the thermoelectric material precursor may be a compound including an element that constitutes the thermoelectric material. For example, the thermoelectric material precursor may comprise at least one selected from an oxide, a hydroxide, a nitride, and a chloride of an element that belongs to Group III to Group VI of the Periodic Table, but is not limited thereto, and any suitable precursor known in the art may be used. For example, the thermoelectric material precursor may be a precursor compound of elements including at least one selected from Bi, Sb, Te, and Se. For example, the thermoelectric material precursor may be $BiCl_4$, $Bi(NO_3)_3 \cdot 5H_2O$, $Na_2TeO_3$, $Na_2SeO_3$, or $Se(OH)_6$.

In the preparation method, a solvent of the solution may comprise at least one selected from ethyleneglycol, propyleneglycol, cysteine, ammonia, deionized water, oleylamine, and monoethanolamine, but is not limited thereto, and any known solvent in the art suitable to prepare a 3D nanostructure may be used.

In the preparation method, the reducing agent may be at least one selected from hydroxylamine ($NH_2OH$), thioglycolic acid, cysteine, ammonia, and monoethanolamine, but is not limited thereto, and any suitable reducing agent in the art suitable to prepare a 3D nanostructure may be used.

In the preparation method, the temperature of the solution may be 100° C. or higher, but is not limited thereto, and any temperature condition that allows a 3D nanostructure to be prepared may be used. For example, the temperature of the solution may be in a range of about 100° C. to about 300° C. For example, the temperature of the solution may be in a range of about 150° C. to about 250° C. For example, the temperature of the solution may be in a range of about 170° C. to about 230° C.

In the preparation method, the 3D nanostructure may be prepared without including a surfactant, and thus contamination by the surfactant during a sintering process may be prevented. Accordingly, a thermoelectric material with a high electrical conductivity may be prepared.

However, if desired, the solution may additionally include a surfactant in the preparation method. The surfactant used in the preparation method is not particularly limited, and any known surfactant in the art and which is suitable to prepare a 3D nanostructure may be used. For example, the surfactant may include sulfur.

One or more embodiments will be described in further detail with reference to the following examples. These examples are for illustrative purposes only and are not intended to limit the scope of the one or more embodiments.

EXAMPLES

Preparation of a 3D Nanostructure Powder

Example 1

Preparation of a $Bi_2Te_3$ 3D Nanostructure Powder 80 milliliters (mL) of ethyleneglycol was added to a round-bottom flask and a mixture of a solution including 0.242 grams (g) of $Na_2TeO_3$ dissolved in 35 mL of ethyleneglycol and a solution including 0.452 g of $Bi(NO_3)_3.5H_2O$ dissolved in 25 ml of ethyleneglycol was added to the flask. The mixture was stirred using a magnetic stirrer at room temperature, and then a temperature of the flask was increased to 180° C. in a nitrogen atmosphere. As a color of the mixture changed from transparent to white to finally dark blue, the reaction was completed, and thus a $Bi_2Te_3$ single crystalline seed was formed. Then, a solution including 2.4 mL of $NH_2OH$ as a reducing agent dissolved in 20 mL of ethyleneglycol was added to the flask, and as a color of the mixture changed to dark purple, a $Bi_2Te_3$ nano-tree, i.e., a 3D nanostructure, was precipitated.

The flask was cooled to room temperature in a nitrogen atmosphere, after completion of the precipitation reaction and additional 10 minutes pause, to prevent oxidation of the product. The obtained mixture was centrifuged at a rate of 12000 revolutions per minute ("RPM") for 10 minutes, and the precipitate was washed with a mixed solution of 300 mL of acetone and 60 mL of water to obtain a nano-tree powder of $Bi_2Te_3$.

Figure 2A:
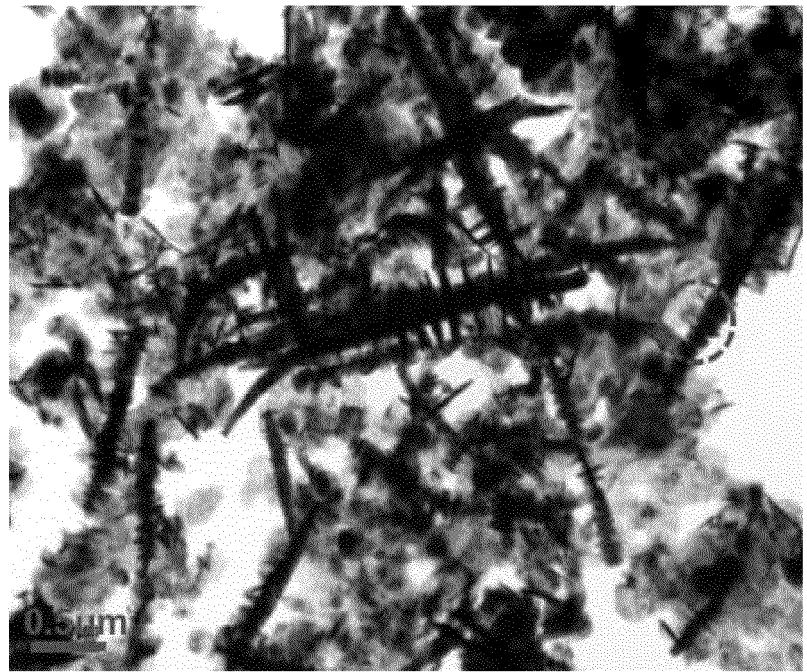
FIG. 2A is a transmission electron microscope ("TEM") image of a 3D nanostructure prepared in Example 1.
Figure 2B:
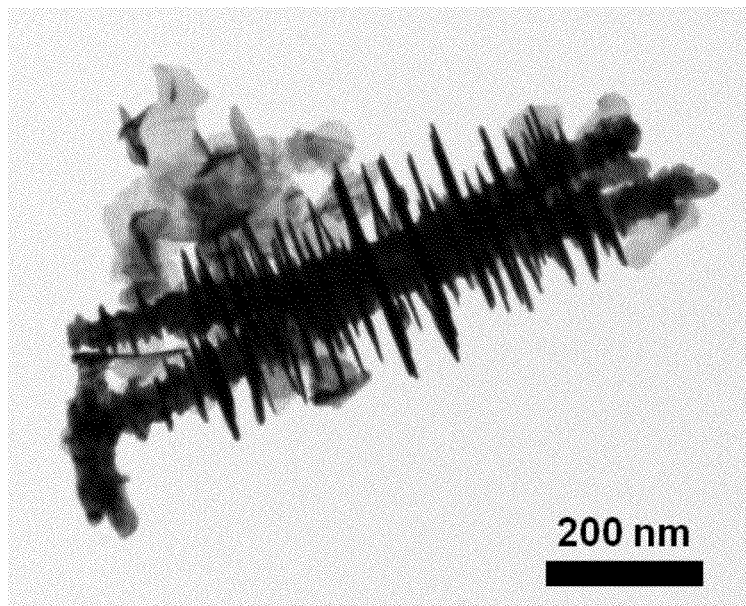
FIG. 2B is an enlarged view of FIG. 2A.
Figure 2C:
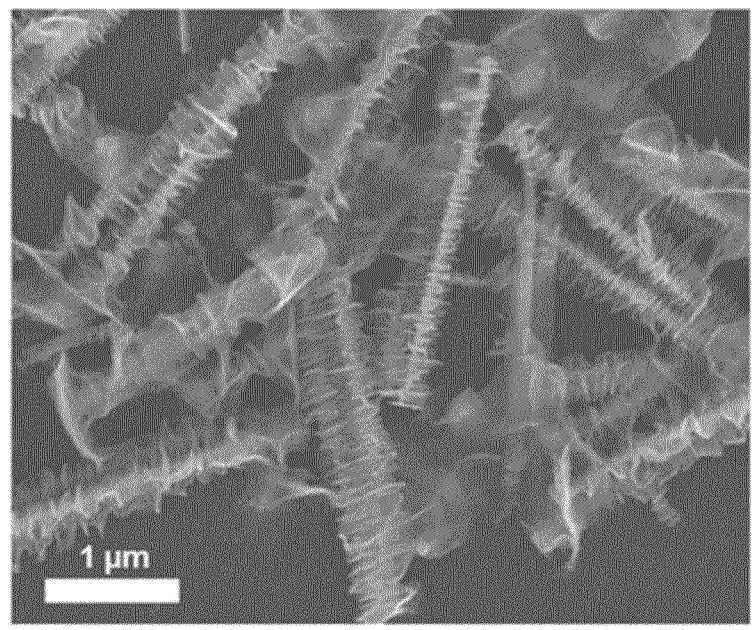
FIG. 2C is a scanning electron micrograph ("SEM") image of a 3D nanostructure prepared in Example 4.

Transmission electron microscope ("TEM") images of the obtained nano-tree powder of $Bi_2Te_3$ are shown in FIGS. 2A and 2B. As shown in FIGS. 2A and 2B, a 3D nanostructure was formed by connecting 2D nanostructures of a nanoplate type on a 1D nanostructure of a nanowire type.

A diameter of the 1D nanostructure was about 50 nanometers (nm) to about 300 nm, and a thickness of the 2D nanostructure was less than about 100 nm.

Example 2

Preparation of a Bulk $Bi_2Te_3$ 3D Nanostructure

The nanostructure powder prepared in Example 1 was added to a mold formed of graphite, and the nanostructure was pressure-sintered with a spark plasma sintering in a vacuum of $10^{-2}$ torr or less at a pressure of 500 MPa and at a temperature of 220° C. for 3 minutes to prepare a nanobulk $Bi_2Te_3$ 3D nanostructure.

Figure 3A:
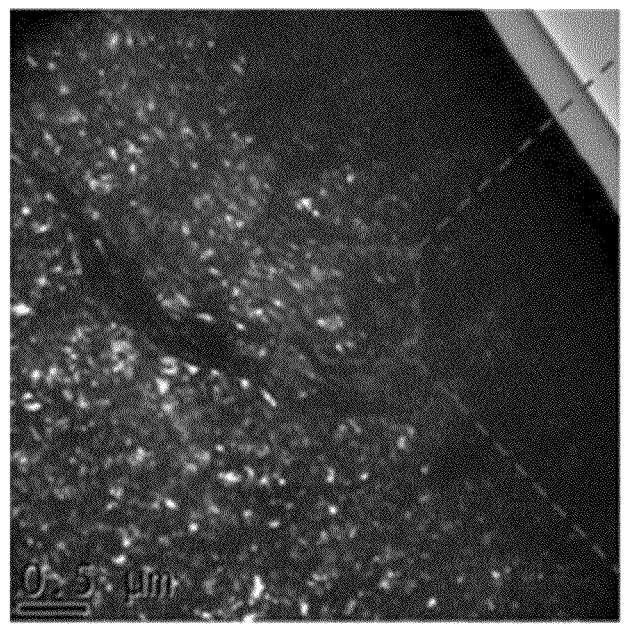
FIG. 3A is a TEM image of a nanobulk thermoelectric material prepared in Example 2.
Figure 3B:
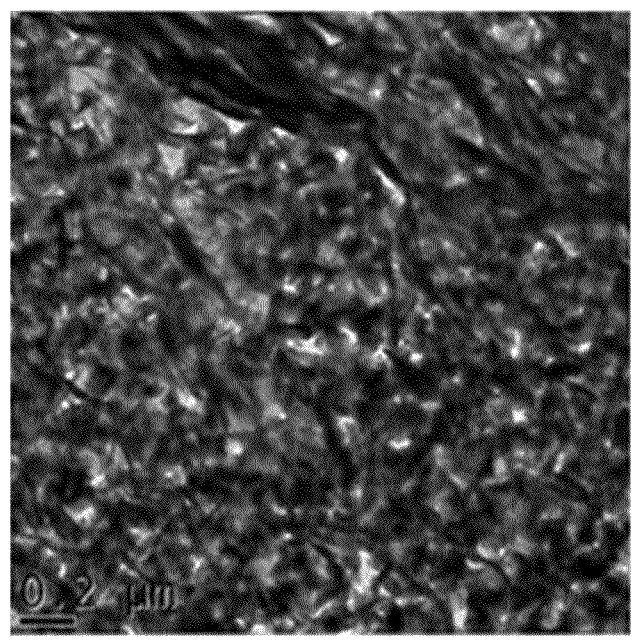
FIG. 3B is an enlarged view of the indicated portion of FIG. 3A.

TEM images of the nanobulk 3D nanostructure retaining a nanostructure are shown in FIGS. 3A and 3B.

As a nanostructure of the thermoelectric material is retained in the bulk, scattering of phonons increases, and thus the thermoelectric material may have a structure similar to a kind of phonon glass electron crystal ("PGEC") through which electrons may easily pass.

Example 3

Preparation of a $Bi_2Se_3$ 3D Nanostructure Powder

A 3D nanostructure was obtained in the same manner as in Example 1, except that a solution including 0.242 g of $Na_2SeO_3$ dissolved in 35 mL of ethyleneglycol was used instead of the solution including 0.242 g $Na_2TeO_3$ dissolved in 35 mL of ethyleneglycol.

Example 4

A 3D nanostructure was obtained in the same manner as in Example 1, except that the flask was cooled to room temperature in a nitrogen atmosphere, after completion of the precipitation reaction and additional 60 minutes pause, to prevent oxidation of the resultant.

Comparative Example 1

Preparation of a $Bi_2Te_3$ Nanoplate Powder

A $Bi_2Te_3$ nanoplate powder was prepared in the same manner disclosed in *J. Am. Chem. Soc.*, 2012, 134 (6), pp 2872-2875, the content of which is incorporated herein by reference in its entirety.

Preparation of a Bulk-Shaped 3D Nanostructure

Comparative Example 2

Preparation of a Bulk-Shaped $Bi_2Te_3$ Nanoplate

A bulk-shaped nanoplate was prepared in the same manner as in Example 1, except that the nanostructure powder prepared in Comparative Example 1 was used instead of the nanostructure powder prepared in Example 1.

Evaluation Example 1

Figure 4A:
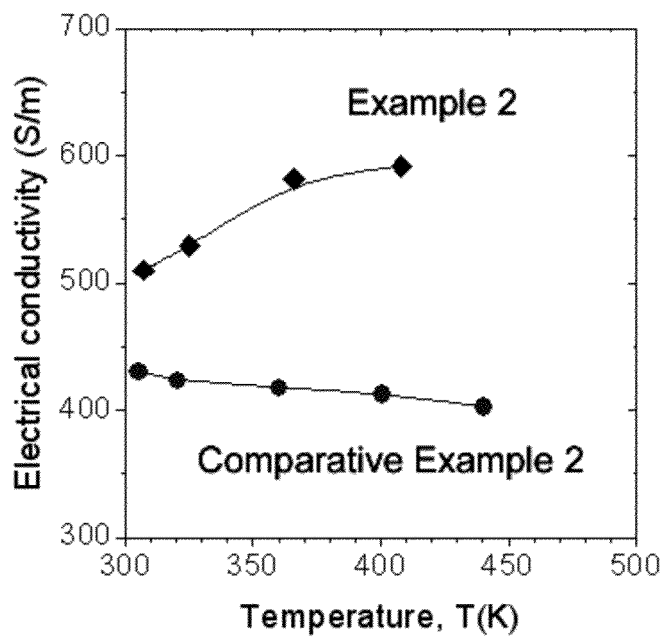
FIG. 4A is a graph of electrical conductivity (Siemens per centimeter, S/cm) versus temperature (Kelvin, K) of the thermoelectric materials prepared in Example 2 and Comparative Example 2.
Figure 4B:
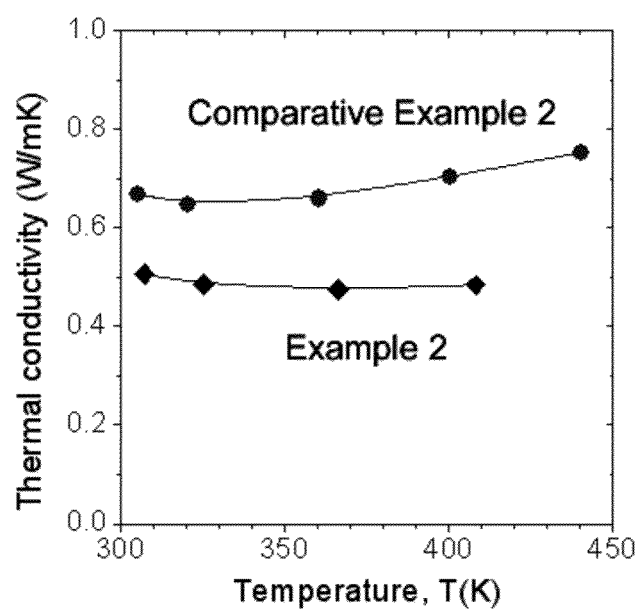
FIG. 4B is a graph of thermal conductivity (Watts per meter-Kelvin, W/mK) versus temperature (Kelvin, K) of the thermoelectric materials prepared in Example 2 and Comparative Example 2.
Figure 4C:
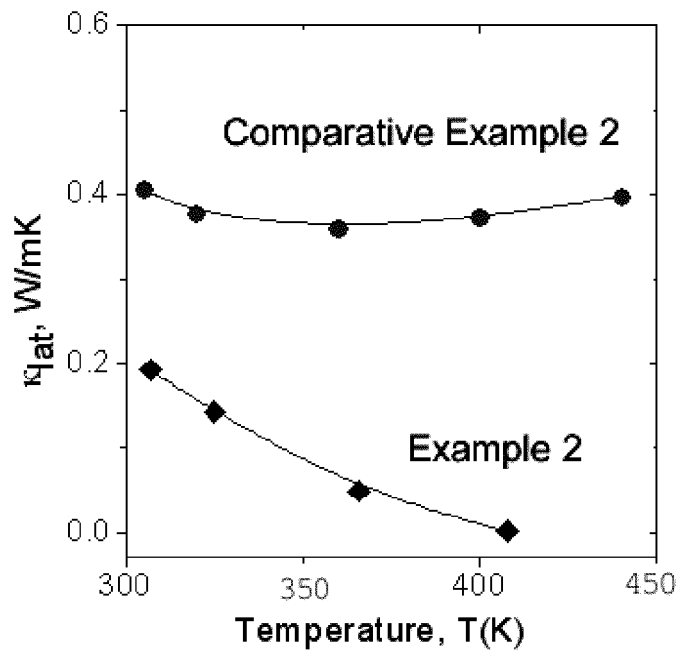
FIG. 4C is a graph of lattice thermal conductivity (Watts per meter-Kelvin, W/mK) versus temperature (Kelvin, K) of the thermoelectric materials prepared in Example 2 and Comparative Example 2.
Figure 4D:
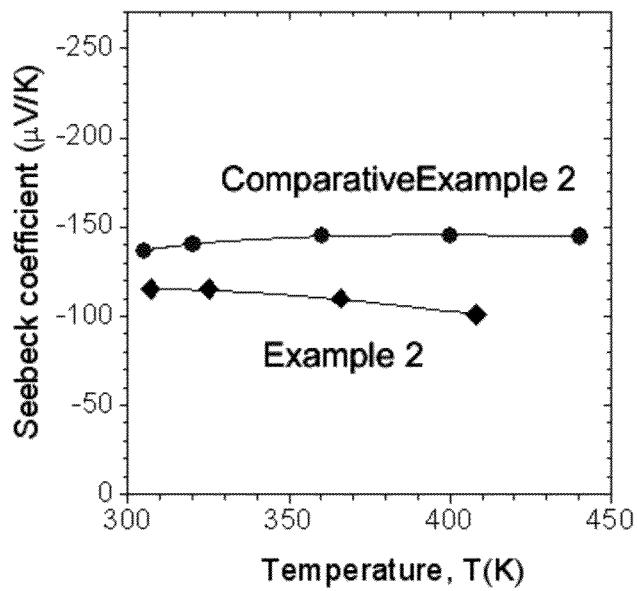
FIG. 4D is a graph of Seebeck coefficient (microvolts per Kelvin, pV/K) versus temperature (Kelvin, K) of the thermoelectric materials prepared in Example 2 and Comparative Example 2.
Figure 4E:
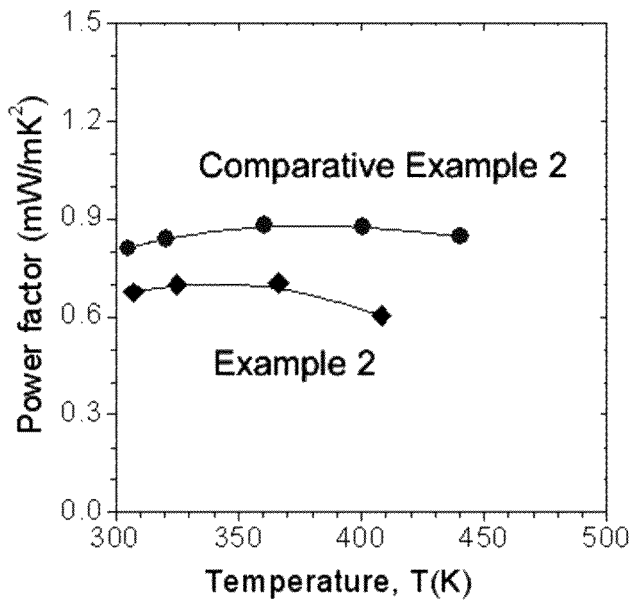
FIG. 4E is a graph of power factor (milliWatts per meter-square Kelvin, mW/mK$^2$) versus temperature (Kelvin, K) of the thermoelectric materials prepared in Example 2 and Comparative Example 2.

Electrical conductivities and Seebeck coefficients of the thermoelectric materials prepared in Example 2 and Comparative Example 2 were measured using a ZEM-3 analyzer manufactured by ULVAC-RIKO, and the results are shown in FIGS. 4A and 4D respectively.

The thermal conductivities of the thermoelectric materials prepared in Example 2 and Comparative Example 2 were calculated from thermal diffusivity measured using a ULVAC TC-9000H analyzer (a laser flash method), and illustrated in FIG. 4B. The lattice thermal conductivities were calculated with an assumption of a Lorentz constant ($L=2\times10^{-8}$ WOhm $K^{-2}$), and the results are shown in FIG. 4C.

Figure 4F:
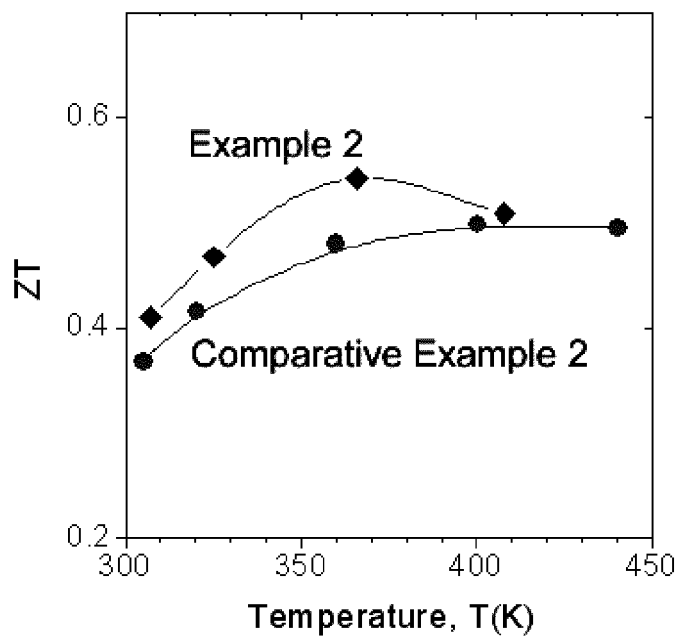
FIG. 4F is a graph of figure of merit (ZT) versus temperature (Kelvin, K) of the thermoelectric materials prepared in Example 2 and Comparative Example 2.

The results of the figures of merit (ZT) calculated from the results above are shown in FIG. 4F.

As shown in FIGS. 4A to 4F, when compared to the thermoelectric material including the nanoplates of 2D nanostructures prepared in Comparative Example 2, the thermoelectric material including the nano-tree of a 3D nanostructure prepared in Example 2 has 50% increased electrical conductivity, an insignificant increase in the Seebeck coefficient, and 30% reduced thermal conductivity, thus resultantly the figure of merit (ZE) of the thermoelectric material was increased.

Also, the thermoelectric material of Example 2 has significantly reduced lattice thermal conductivity compared to that of the thermoelectric material of Comparative Example 2.

As described above, according to the disclosed embodiments, a figure of merit of a thermoelectric material may improve when scattering of phonons increase at an interface as the thermoelectric material includes a 3D nanostructure with a novel structure.

It should be understood that the exemplary embodiments described herein should be considered in a descriptive sense only and not for purposes of limitation. Descriptions of features, advantages, or aspects within each embodiment should be considered as available for other similar features, advantages, or aspects in other embodiments.

What is claimed is:

1. A thermoelectric material comprising:
   a 3-dimensional nanostructure, wherein the 3-dimensional nanostructure comprises a plurality of 2-dimensional nanostructures connected to a 1-dimensional nanostructure, wherein adjacent 2-dimensional nanostructures of the plurality of 2-dimensional nanostructures are spaced apart from each other on the 1-dimensional nanostructure, and
   wherein the 1-dimensional nanostructure is exposed between the adjacent 2-dimensional nanostructures.

2. The thermoelectric material of claim 1, wherein the 1-dimensional nanostructure is in the form of a nanowire.

3. The thermoelectric material of claim 1, wherein the 2-dimensional nanostructures are in the form of nanoplates.

4. The thermoelectric material of claim 1, wherein the 2-dimensional nanostructures have a shape of at least one selected from a circle, an oval, a hexagon, a rectangle, a pentagon, a triangle, a bar shape, and a needle shape.

5. The thermoelectric material of claim 1, wherein the 1-dimensional nanostructure penetrates a surface of the 2-dimensional nanostructures.

6. The thermoelectric material of claim 1, wherein the 1-dimensional nanostructure penetrates a plurality of the 2-dimensional nanostructures, which are disposed at a selected interval.

7. The thermoelectric material of claim 6, wherein the plurality of 2-dimensional nanostructures are oriented in a first direction.

8. The thermoelectric material of claim 1, wherein at least a portion of the 2-dimensional nanostructure comprises a twist such that a direction perpendicular to a plane of the 2-dimensional nanostructure varies with a distance from the 1-dimensional nanostructure.

9. The thermoelectric material of claim 1, wherein the 1-dimensional nanostructure and the 2-dimensional nanostructures form a single unitary body.

10. The thermoelectric material of claim 1, wherein the 3-dimensional nanostructure comprises a semiconductor comprising at least one element selected from Group III to Group VI of the Periodic Table of the Elements.

11. The thermoelectric material of claim 1, wherein the 3-dimensional nanostructure comprises a chalcogenide compound.

12. The thermoelectric material of claim 1, wherein the 3-dimensional nanostructure comprises at least one compound selected from Formulas 1 to 2 below:

$$Bi_{2-x}Te_y, \text{ wherein } 0 \leq x < 2, 0 < y \leq 3, \text{ and} \qquad \text{Formula 1}$$

$$Bi_{2-x}Se_y, \text{ wherein } 0 \leq x < 2, 0 < y \leq 3. \qquad \text{Formula 2}$$

13. The thermoelectric material of claim 1 comprising a nanobulk material comprising the 3-dimensional nanostructure.

14. The thermoelectric material of claim 1 further comprising at least one nanostructure having a form selected from nanoplates, nanodisks, nanosheets, nanowires, nanofibers, nanobelts, nanotubes, nanocrystals, and nanopowders.

15. The thermoelectric material of claim 1 further comprising a bulk thermoelectric material matrix that is chemically inactive to the 3-dimensional nanostructure.

16. The thermoelectric material of claim 15, wherein the 3-dimensional nanostructure is disposed at a crystal interface or within a crystal structure of the bulk crystalline thermoelectric material matrix.

17. A thermoelectric element comprising the thermoelectric material of claim 1.

18. A thermoelectric module comprising:
   a first electrode;
   a second electrode; and
   the thermoelectric element of claim 17 interposed between the first electrode and the second electrode.

19. The thermoelectric module of claim 18, wherein the module is used in a thermoelectric apparatus selected from a thermoelectric generator, a thermoelectric cooler, and a thermoelectric sensor.

20. A method of preparing a thermoelectric material comprising:
   forming a seed by stirring a solution comprising a thermoelectric material precursor at a temperature of 100° C. or greater; and
   forming of a 3-dimensional nanostructure by adding a reducing agent to the solution comprising the seed to prepare the thermoelectric material, wherein the 3-dimensional nanostructure comprises a plurality of 2-dimensional nanostructures connected to a 1-dimensional nanostructure, wherein adjacent 2-dimensional nanostructures of the plurality of 2-dimensional nanostructures are spaced apart from each other on the 1-dimensional nanostructure, and
   wherein the 1-dimensional nanostructure is exposed between the adjacent 2-dimensional nanostructures.

21. The thermoelectric material of claim 1, wherein a surface of each of the 2-dimensional nanostructures each independently forms an angle of about 45 to about 90 degrees with a direction of an axis of the 1-dimensional nanostructure.

22. The thermoelectric material of claim 21, wherein the 2-dimensional nanostructures each independently have a thickness of about 10 nanometers to about 300 nanometers.

23. The thermoelectric material claim 22, wherein a diameter of the 1-dimensional nanostructure has a difference between a maximum diameter and a minimum diameter of less than about 50 percent along a direction of a longitudinal axis of the 1-dimensional nanostructure.

24. The thermoelectric material of claim 22, wherein the 2-dimensional nanostructures each independently have a surface area of about 3 square nanometers to about 1000 square nanometers.

* * * * *